United States Patent [19]
Shirland

[11] 3,975,211
[45] Aug. 17, 1976

[54] SOLAR CELLS AND METHOD FOR MAKING SAME

[75] Inventor: Fred A. Shirland, Murrysville, Pa.

[73] Assignee: Westinghouse Electric Corporation, Pittsburgh, Pa.

[22] Filed: Mar. 28, 1975

[21] Appl. No.: 563,421

[52] U.S. Cl. .................................. 136/89; 29/572; 148/174; 148/175; 427/74; 357/16
[51] Int. Cl.$^2$ ................. H01L 31/04; B05D 5/12
[58] Field of Search ............ 136/89; 148/175, 174; 427/74; 29/572; 357/16

[56] References Cited
UNITED STATES PATENTS

| | | | |
|---|---|---|---|
| 2,820,841 | 1/1958 | Carlson et al. | 136/89 |
| 3,284,252 | 11/1966 | Grimmeiss et al. | 148/188 |
| 3,290,175 | 12/1966 | Cusano et al. | 136/89 |
| 3,374,108 | 3/1968 | Keramidas | 136/89 X |
| 3,416,956 | 12/1968 | Keramidas et al. | 136/89 X |
| 3,480,473 | 11/1969 | Tands | 136/89 X |
| 3,483,038 | 12/1969 | Hui et al. | 136/89 |

OTHER PUBLICATIONS

B. L. Sharma et al., "Semiconductor Heterojunctions", Pergamon, 1974, pp. 171–173.
D. M. Perkins, "Recent Progress of Thin Film Solar Cells", *Advanced Energy Conversion*, vol. 7, pp. 265–274 (1968).
L. Clarke et al. "New Development in Degradation-Resistant CdS Solar Cells", Paper No. 38, 7th International Power source Symposium, England (1970).
H. I. Moss, "Large Area Thin–Film Photovoltaic Cells", *RCA Review*, Mar. 1961, pp. 29–37.
J. Matsuzaki, "Tech. J. Japan. Broadcasting Corp., vol. 21, No. 6, pp. 45–62 (1969).

*Primary Examiner*—John H. Mack
*Assistant Examiner*—Aaron Weisstuch
*Attorney, Agent, or Firm*—C. L. Menzemer

[57] ABSTRACT

Solar cell elements are produced in accordance with the present invention in which a $Cu_2S$ thin film is epitaxially formed on a CdS film by vacuum deposition in a heterojunction forming relationship. By a first method a $Cu_2S$ layer on the order of 1/100 micron in thickness is formed on a CdS polycrystalline thin film by dipping in a solution of cuprous ions. The CdS film itself is less than 5 microns thick and rests on a conductive substrate. After the dipping step the $Cu_2S$ film is increased to a thickness on the order of 1/10 micron by vapor evaporation of an additional amount of $Cu_2S$. By a second method both the CdS and $Cu_2S$ are entirely vapor deposited on a substrate to achieve approximately the same final structure as the first method.

6 Claims, 6 Drawing Figures

SOLAR CELLS AND METHOD FOR MAKING SAME

CROSS-REFERENCE TO RELATED APPLICATION

The present application is related to application Ser. No. 563,420 filed on Mar. 28, 1975, by the same inventor on the subject of backwall CdS thin film solar cells.

BACKGROUND OF THE INVENTION

1. Field of the Invention

The present invention relates to solar cells and particularly to $Cu_2S$-CdS thin film solar cells.

2. Description of the Prior Art

Present high output CdS thin film solar cells are made by vacuum depositing a CdS film on a conductive substrate, then converting its surface to $Cu_2S$ by dipping it in a solution containing cuprous ions. Cuprous ions in the solution chemically interchange with and displace cadmium ions in the CdS crystal lattice thereby forming a very thin layer of $Cu_2S$ with the same structure and lattice spacing as the CdS. However, the $Cu_2S$ also forms in the boundaries between the CdS grains, penetrating about 10 to 15 microns or more into the CdS film, which is generally 25 to 30 microns thick. If the CdS layer is made thinner and approaches 15 microns or less in thickness, short circuits occur due to the $Cu_2S$ penetrating therethrough down to the conductive substrate. If the ion exchange reaction is reduced to give much less penetration of the grain boundaries, then the $Cu_2S$ layer formed is too thin for effective absorption of the incident light. While a thick CdS layer is not desired, it must be employed in such prior practice. The present invention solves this problem, thereby providing solar cells with much thinner CdS layers.

SUMMARY OF THE INVENTION

A very thin $Cu_2S$ layer is formed on the surface of a film of polycrystalline CdS, the CdS film being much thinner than any successfully used in the prior art. The $Cu_2S$ film is formed by dipping in a solution of cuprous ions just long enough for a reaction to form an extremely thin continuous $Cu_2S$ layer, but not long enough to short through the CdS grain boundaries to the substrate. The thickness of the resulting $Cu_2S$ layer is then built up by vacuum evaporation of $Cu_2S$ to a sufficient thickness to efficiently absorb most of the effective wavelength photons of the solar spectrum. The initial $Cu_2S$ layer formed chemically has the appropriate crystal orientation for efficient operation, and the vapor deposited $Cu_2S$ assumes this same crystal texture.

In an alternative approach a $Cu_2S$-CdS heterojunction solar cell is produced by vacuum depositing CdS on a conducting substrate by conventional techniques and abruptly stopping the evaporation of CdS and immediately starting the evaporation of $Cu_2S$ onto the CdS film, which results in an epitaxial $Cu_2S$ layer on the CdS film.

DESCRIPTION OF THE PREFERRED EMBODIMENTS

Figure 1:
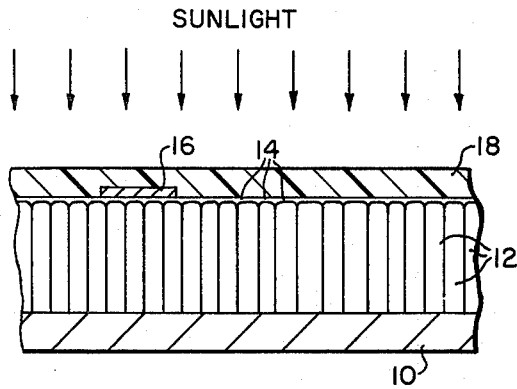
FIG. 1 is an enlarged cross-sectional view of a CdS-$Cu_2S$ thin film solar cell of the prior art.

The CdS polycrystalline films used for thin film solar cells are typically 20 to 30 microns thick with individual gains approximately 1 micron in width and extending the full thickness of the film. The CdS forms in the hexagonal or "Wurtzite" crystal structure and has a preferred orientation with the "C" axes of the individual grains generally oriented perpendicular to the substrate, but with the three "A" axes randomly oriented in directions generally parallel to the plane of the substrate. These CdS films are usually produced by evaporating CdS in a vacuum onto a conductive substrate 10 such as a smooth polished metal sheet as shown in FIG. 1.

Figure 1A:
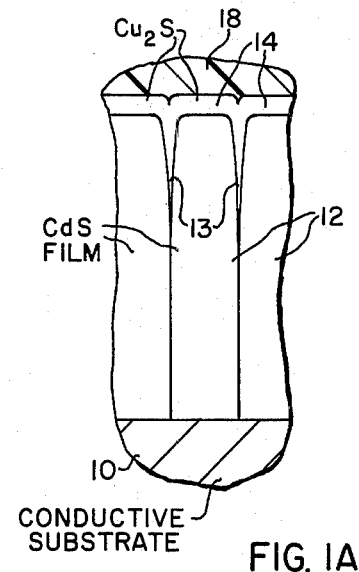
FIG. 1a is a greatly enlarged view of a portion of FIG. 1.

CdS thin film solar cells of the prior art are usually formed by dipping the substrate 10 with the applied polycrystalline CdS film 12 thereon, into a solution containing cuprous ions. These $Cu^+$ ions displace cadmium ions to form a $Cu_2S$ layer 14 at the CdS surface. The sulfur atoms of $Cu_2S$ layer 14 so formed maintain the same geometrical spacing that they had in the original CdS crystallites. The $Cu_2S$ layer 14 is on the order of a few hundred atomic layers thick, thus yielding what amounts to an epitaxial structure of $Cu_2S$ on CdS. The $Cu_2S$ layer 14 is thin enough so that the stresses from lattice spacing mis-match do not build up sufficiently to cause the $Cu_2S$ to fracture mechanically. The $Cu_2S$ material also forms in the boundaries 13 between the CdS grains, as illustrated in FIG. 1a, penetrating to a depth of about 10 to 15 microns, that is, to ⅓ to ½ of the total film thickness for a 20 to 30 micron thick film. This structure is generally favorable since the irregularly convoluted structure of the $Cu_2S$ layer 14 results in a much higher proportion of the incident light being absorbed in the $Cu_2S$ than would be the case if the same thickness of $Cu_2S$ were formed only at the upper surface of the CdS film 12.

Referring again to FIG. 1, the device in final form includes a metallic grid 16 applied to the surface of the $Cu_2S$ layer 14. A transparent coating 18 is applied over the $Cu_2S$ layer 14 and the grid 16 in a known manner to protect the device.

For very low cost solar cells, the CdS film should be made much thinner; however, then the $Cu_2S$ layer would penetrate to the conductive substrate 10 sufficiently to short circuit the cell. If the time of the reaction in the cuprous ion solution is made very short or if the acidity of this solution is reduced so that penetration into the grain boundaries is considerably reduced, then the $Cu_2S$ layer formed would be too thin for adequate light absorption and the solar cell would be low in conversion efficiency.

Figure 2:
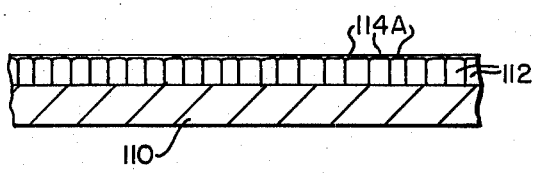
FIG. 2 is an enlarged cross-sectional view of a CdS-$Cu_2S$ thin film solar cell after dipping in $Cu^+$ ion solution in accordance with an initial step in the practice of the present invention.
Figure 3:
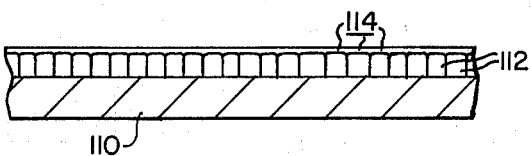
FIG. 3 is an enlarged cross-sectional view of a CdS-$Cu_2S$ thin film solar cell after vacuum deposition of $Cu_2S$ in accordance with a subsequent step in the practice of the present invention.

This problem is overcome in the first method of practicing the invention as shown in FIGS. 2 and 3. By initially making a thin CdS film 112 of about 5 microns in thickness, then forming only a very thin $Cu_2S$ layer 114A (on the order of 0.01 micron) by conventional dipping techniques for such short time periods that penetration of the $Cu_2S$ layer 114A through the grain boundaries of the CdS layer 112 does not take place and short circuiting cannot occur. The thickness of the $Cu_2S$ is then built up to the desired value by vacuum deposition of $Cu_2S$ in a known manner. In accordance with the teachings of U.S. Pat. No. 3,146,138, $Cu_2S$ can be vacuum evaporated to form barrier layers on the CdS crystals, but it has been found that these all-evaporated $Cu_2S$ barriers have low efficiencies. This is probably because using prior art techniques, a vacuum evaporated $Cu_2S$ layer applied directly on a CdS layer does not deposit epitaxially on the CdS as does $Cu_2S$ applied on CdS by the ion exchange technique. By producing a first epitaxial $Cu_2S$ structure initiated by conventional methods, the growth of the $Cu_2S$ epitaxial layer could be continued successfully by using vacuum deposition techniques, such an epitaxial layer being illustrated by FIGS. 3 and 3a.

In order to cause the vacuum deposited $Cu_2S$ layer 114B to grow epitaxially on the $Cu_2S$ layer 114A already formed by the ion-exchange process, it may be necessary to sputter-etch a few atomic layers of the $Cu_2S$ surface 115 immediately prior to the onset of $Cu_2S$ vacuum deposition proper. Such sputter-etch cleaning techniques are well known in the field. The sputter-etching removes any absorbed gas layer as well as any impurities from the surface 115 of the $Cu_2S$ layer 114A so that good epitaxial growth can occur and so that there will not be a spurious or irregular interface between the chemically formed portion 114A and vacuum deposited portion 114B of the $Cu_2S$ layer 114 to degrade its semi-conducting properties.

Figure 2A:
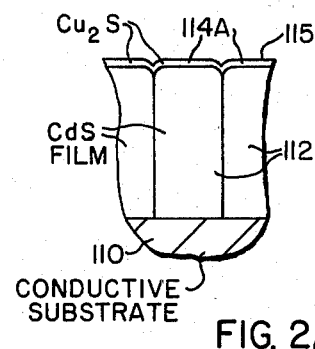
FIG. 2a is a greatly enlarged view of a portion of FIG. 2.
Figure 3A:
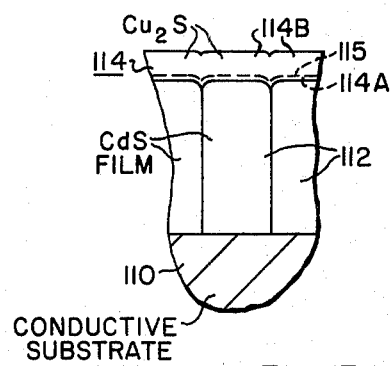
FIG. 3a is a greatly enlarged view of a portion of FIG. 3.

FIGS. 2 and 3 illustrate the structure of a CdS-$Cu_2S$ thin film solar cell formed by the first method of practicing the invention. FIG. 2a illustrates an enlarged cross-sectional view of the structure of the $Cu_2S$ layer 114A and the CdS layer 112 after the ion-exchange process. FIG. 3a illustrates an enlarged cross-sectional view the structure after the $Cu_2S$ layer 114 has been built up by vacuum deposition. The dotted line 115 denotes the point where the vacuum deposited portion 114B is epitaxially grown on the chemically formed portion 114A.

An advantage of this technique is that efficient solar cells may be made from very thin CdS films, since thicker $Cu_2S$ layers can be formed on the thinner CdS films without shorting out the $Cu_2S$ to the underlying conductive substrate. The thicker $Cu_2S$ layers are needed to increase the absorption of light to make up for the loss of the convoluted structure of the $Cu_2S$ layers normally formed on thicker CdS films. The thinner CdS films are necessary in order to limit the amount of semi-conducting CdS material in the cells so that very low cell costs will be possible.

A possibly more advantageous alternative method is the use of all vacuum processing to produce essentially the same final structure illustrated in FIGS. 3 and 3a where the $Cu_2S$ layer 114 is entirely formed in one step, there being no ion-exchange dipping step. Instead of employing separate CdS and $Cu_2S$ evaporations, the CdS and $Cu_2S$ layers are evaporated sequentially in the same vacuum pumpdown, by manipulating shutters covering heated crucibles containing CdS and $Cu_2S$, to switch from initially depositing the CdS layer 112 on the substrate 110 to depositing the entire $Cu_2S$ layer 114 on the CdS. In this manner only a fraction of a second in time elapses between the completion of the CdS film 112 formation and the start of the $Cu_2S$ film 114 formation, thus providing an appropriate environment for epitaxially growing the $Cu_2S$ on the CdS, thereby overcoming the all-evaporated problem in the prior art. Thus a clean heterojunction will occur between the two semiconductor layers 112 and 114 and this permits optimization of thickness, growth rate, composition and doping of both layers 112 and 114 independently.

Similar shutter techniques have been used to make adherent coatings of one material onto a film of another material. However, as far as is known, they have not been used to make semiconductor heterojunctions and specifically not $Cu_2S$-CdS heterojunctions. The ability to epitaxially grow $Cu_2S$ on CdS will enhance the electrical properties of solar cells and enable efficient and inexpensive harvesting of solar energy with such solar cells.

What is claimed is:

1. A method for making a solar cell structure comprising the steps:
    a. dipping a polycrystalline CdS thin film into a solution containing cuprous ions, thereby forming a first polycrystalline $Cu_2S$ thin film layer on said CdS film and
    b. depositing a second $Cu_2S$ layer on said first $Cu_2S$ layer by vacuum deposition.

2. A method as set forth in claim 1 wherein said CdS film is less than about 5 microns thick, said $Cu_2S$ layer formed by step (a) is on the order of 0.01 micron and said $Cu_2S$ layer formed by step (b) is on the order of 0.1 micron.

3. A method for making a solar cell structure comprising the steps:
    a. depositing a polycrystalline thin film layer of CdS on a conductive substrate by vacuum deposition; and
    b. abruptly halting said CdS deposition while simultaneously abruptly initiating vacuum deposition of a polycrystalline thin film layer of $Cu_2S$ on said CdS layer.

4. A method as set forth in claim 3 wherein a shutter is operated to halt step (a) and abruptly initiate step (b) during a single vacuum pump-down.

5. A solar cell comprising a conductive substrate, a polycrystalline CdS thin film layer disposed on said substrate, a polycrystalline $Cu_2S$ thin film layer disposed on said CdS layer, said $Cu_2S$ layer comprising an ion-exchange produced first thin portion penetrating only partly into the grain boundaries of the CdS layer and a vapor deposited second portion overlying said first thin portion, said second portion exceeding said first portion in thickness.

6. A solar cell as set forth in claim 5 wherein said CdS layer has a thickness of about 5 microns, said first portion of said $Cu_2S$ layer has a thickness on the order of 0.01 micron, and said second portion of said $Cu_2S$ layer has a thickness on the order of 0.1 micron.

* * * * *